United States Patent
Wada

(10) Patent No.: US 6,453,449 B1
(45) Date of Patent: Sep. 17, 2002

(54) FORMAL LOGIC VERIFICATION SYSTEM AND METHOD

(75) Inventor: Yasushi Wada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/360,641

(22) Filed: Jul. 26, 1999

(30) Foreign Application Priority Data

Feb. 23, 1999 (JP) .......................................... 11-045025

(51) Int. Cl.[7] .............................................. G06F 17/50
(52) U.S. Cl. ......................................................... 716/5
(58) Field of Search ........................................ 716/3, 5

(56) References Cited

U.S. PATENT DOCUMENTS

| | | | | |
|---|---|---|---|---|
| 5,867,395 A | * | 2/1999 | Watkins ........................ | 716/18 |
| 6,226,777 B1 | * | 5/2001 | Zhang ............................ | 716/5 |
| 6,301,687 B1 | * | 10/2001 | Jain et al. ....................... | 716/3 |

FOREIGN PATENT DOCUMENTS

JP          1-137372          5/1989

* cited by examiner

*Primary Examiner*—John F. Niebling
*Assistant Examiner*—Stacy Whitmore
(74) *Attorney, Agent, or Firm*—McDermott, Will & Emery

(57) ABSTRACT

There is described a means of shortening of the time required for verification by a formal logic verification system which compares details of a circuit represented in the form of a register transfer level (RTL) description with details of the circuit represented in the form of a gate level netlist. Logical equivalence between an RTL description and a gate level netlist obtained through logical compilation of the RTL descriptions is verified. In a case where a plurality of blocks having the same function are included in the circuit, one of a plurality of descriptions that are included in the netlist and relate to the function is compared with the RTL description relating to the functional blocks (comparison ①). If one of the descriptions of the netlist has already been verified, a plurality of descriptions included in the netlist are compared with the description that is taken as the first reference description.

14 Claims, 9 Drawing Sheets

FIG. 2

```
module LSI(Y, A, B, C, D);
input A, B, C, D;
output Y;

wire N1, N2;

assign Y=N1 & N2;

CODE U1(N1, A, B);
CODE U2(N2, C, D);

endmodule module CODE(Y, A, B);
 imput A, B;
 output Y;
    (OMISSION:RTL DESCRIPTION)
endmodule
```

FIG. 3

```
module LSI(Y, A, B, C, D);
input A, B, C, D;
output Y;

wire N1, N2;

and(Y, N1, N2);

CODE_1 U1(N1, A, B);
CODE_2 U2(N2, C, D);

endmodule module CODE_1(Y, A, B);
input A, B;
output Y;
   (OMISSION:Gate Level Netlist)
endmodule module CODE_2(Y, A, B);
input A, B;
output Y;
   (OMISSION:Gate Level Netlist)
endmodule
```

FIG. 4

```
CODE··CODE_1
CODE··CODE_2
```

FIG. 5

```
module LSI(Y,A,B,C,D);
input A,B,C,D;
output Y;
wire N1,N2;

assign Y=N1 & N2;
CODE U1(N1,A,B);
CODE U2(N2,C,D);
endmodule module CODE(Y,A,B);
input A,B;
output Y;
    (OMISSION:RTL DESCRIPTION)
endmodule ADD SU1(net1,A,X);
ADD SU2(net2,B,Z);
    (OMISSION:RTL DESCRIPTION)
endmodule module ADD(Y,A,B);
input A,B;
output Y;
    (OMISSION:RTL DESCRIPTION)
endmodule
```

FIG. 6

```
level 0 LSI
level 1 CODE
level 2 ADD
```

FIG. 7

```
module LSI (Y, A, B, C, D) ;
 input A, B, C, D;
 output Y;
 wire N1, N2;

and (Y, N1, N2) ;
 CODE_1 U1 (N1, A, B) ;
 CODE_2 U2 (N2, C, D) ;
endmodule module CODE_1 (Y, A, B) ;
 input A, B;
 output Y;
 ADD_11 SU1 (net1, A, X) ;
 ADD_12 SU2 (net2, B, Z) ;
    (OMISSION:Gate Level Netlist)
endmodule module CODE_(2Y, A, B) ;
 input A, B;
 output Y;
 ADD_21 SU1 (net1, A, X) ;
 ADD_22 SU2 (net2, B, Z) ;
    (OMISSION:Gate Level Netlist)
endmodule module ADD_11 (Y, A, B) ;
    (OMISSION:Gate Level Netlist)
endmodule module ADD_12 (Y, A, B) ;
    (OMISSION:Gate Level Netlist)
endmodule module ADD_21 (Y, A, B) ;
    (OMISSION:Gate Level Netlist)
endmodule module ADD_22 (Y, A, B) ;
    (OMISSION:Gate Level Netlist)
endmodule
```

```
CODE  -1      CODE_1  -1
ADD   -1      CODE_2  -1
              ADD_11  -1
              ADD_12  -1
              ADD_21  -1
              ADD_22  -1
```

```
CODE  -1      CODE_1  -1
ADD    0      CODE_2  -1
              ADD_11   0
              ADD_12   0
              ADD_21   0
              ADD_22   0
```

FORMAL LOGIC VERIFICATION SYSTEM AND METHOD

BACKGROUND OF THE INVENTION

1. Field of the Invention

The present invention generally relates to a formal logic verification system and a formal logic verification method, and more particularly to a formal logic verification system and method in which details of a circuit represented by a register-transfer-level(RTL)-description are compared with details of the circuit represented by a gate-level netlist.

2. Description of the Background Art

During a process of designing a semiconductor integrated circuit, there is usually employed a method of representing a circuit configuration to be implemented in the form of RTL description and then logically compiling the RTL description into a gate-level netlist. The RTL description corresponds to representation of a circuit configuration, in the form of a description corresponding to a combinational logic gate for implementing a specific function and a description relating to transfer of data among registers such as flip-flops and latches. Further, the gate-level netlist corresponds to representation of a circuit configuration through use of logic formulas of gate elements.

FIG. 13 shows one example of an RTL description and a netlist, both of which represent the same circuit configuration. As shown in FIG. 13, in the RTL description, only one description [e.g., module SUB( . . . )] is provided for a plurality of functional blocks (SUB U1 to U3) having the same function. In the RTL description, this description is repeatedly used as a description for higher levels in hierarchy (i.e., functional blocks). In contrast, even when a plurality of functional blocks having the same function exist, descriptions for respective functional blocks (module SUB1 to SUB3) are provided.

To verify equivalence between the logic of an RTL description and the logic of a netlist through formal verification, or to verify logical equivalence between the RTL. description and the netlist through comparison between details of the RTL description and details of the netlist, there hash conventionally been employed a method of comparing a single functional block represented by the RTL description and each of the plurality of functional blocks represented by the netlist [indicated by reference numerals ①, ②, and ③ shown in FIG. 13].

Since the RTL description and the netlist differ in structure, more time is required for comparing an RTL description relating to the functional block with a description relating to the same functional block in the form of a netlist. For this reason, conventional formal verification in which such a comparison is repeatedly carried out requires a long verification time.

SUMMARY OF THE INVENTION

The present invention has been conceived to solve the previously-mentioned problems, and a general object of the present invention is to provide a novel and useful formal logic verification system and method.

A more specific object of the present invention is to provide a formal logic verification system capable of shortening verification time by reducing frequencies of direct comparison between an RTL description and a netlist.

The above objects of the present invention are achieved by a formal logic verification system which verifies logical equivalence between an RTL description and a gate level netlist obtained through logical compilation of the RTL descriptions, through comparison between the RTL description and the gate level netlist. The system includes a RTL-to-netlist comparison unit which, when a plurality of identical functional blocks are included in a circuit, compares an RTL description relating to the functional blocks with one of a plurality of descriptions that relate to the functional blocks and are included in the netlist. The system also includes a netlist-to-netlist comparison unit which compares a plurality of descriptions relating to the functional blocks included in the netlist.

A second object of the present invention is to provide a formal logic verification method that enables shortening of verification time by reducing frequencies of direct comparison between an RTL description and a netlist.

The above objects of the present invention are achieved by a formal logic verification method for verifying logical equivalence between an RTL description and a gate level netlist obtained through logical compilation of the RTL descriptions through comparison between the RTL description and the gate level netlist. The method includes a step for comparing an RTL description relating to functional blocks having the same function with a description of the netlist. The comparison between the RTL description and the netlist is continued until a description logically matching the RTL description is found in a plurality of descriptions in the netlist. The method also includes a step for comparing a plurality of descriptions relating to the functional blocks included in the netlist with each other. The comparison between the netlist descriptions is performed while employing the description of the netlist that is acknowledged to logically match the RTL description as a reference description.

Other objects and further features of the present invention will be apparent from the following detailed description when read in conjunction with the accompanying drawings.

BRIEF DESCRIPTION OF THE DRAWINGS

FIG. 2 shows an example of an RTL description relating to the circuit shown in FIG. 1;

FIG. 3 shows an example of a gate-level netlist relating to the circuit shown in FIG. 1;

FIG. 4 shows an example of block-to-block correspondence information prepared from in the first embodiment of the present invention;

FIG. 5 shows an another example of an RTL description relating to the circuit shown in FIG. 1;

FIG. 6 shows hierarchical information prepared in a second embodiment of the present invention;

FIG. 7 shows an another example of a gate-level netlist relating to the circuit shown in FIG. 1;

DESCRIPTION OF THE PREFERRED EMBODIMENTS

Figure 1:
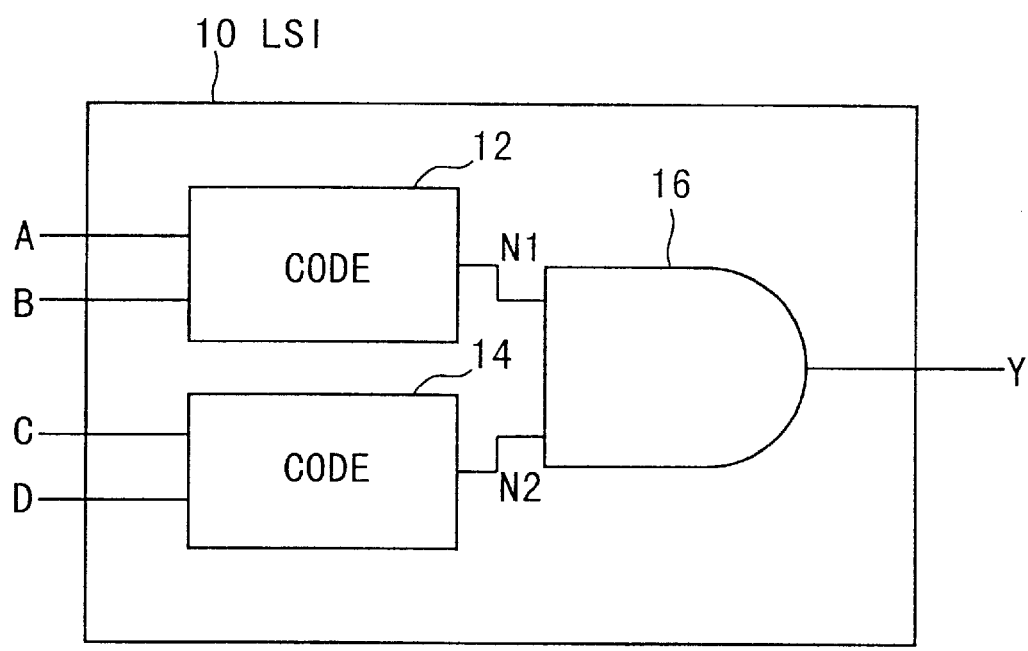
FIG. 1 is a block diagram showing a circuit to be logically verified by a formal logic verification system according to a first embodiment of the present invention.

In the following, principles and embodiments of the present invention will be described with reference to the accompanying drawings. In the drawings, the members and steps that are identical or correspond to each other are given the same reference numerals and repetition of the descriptions may be omitted.

First Embodiment

FIG. 1 is a block diagram showing a circuit to be logically verified by a formal logic verification system according to a first embodiment of the present invention. The circuit shown in FIG. 1 has an LSI 10 as a higher-level block. The LSI 10 comprises, as lower-level blocks, two CODEs 12 and 14 and an AND gate 16.

FIG. 2 shows an RTL description relating to the circuit shown in FIG. 1. FIG. 3 shows a gate-level netlist obtained by logical compilation of the RTL description shown in FIG. 2.

As shown in FIG. 2, in the RTL description, two instance declarations relating to block CODEs are used so as to correspond to CODE 12 and CODE 14, respectively. Further, in the RTL description, only one description [module CODE (Y, A, B)] is provided for these CODEs 12 and 14.

As shown in FIG. 3, CODE 12 and CODE 14 are described individually. More specifically, the netlist comprises a description [module CODE_1(Y,A,B)] corresponding to a block of CODE 12 and a description [module CODE_2(Y,A,B)] corresponding to CODE 14.

The formal logic verification system according to the first embodiment prepares block-to-block correspondence information representing a relationship between block information relating to an RTL description and block information relating to a netlist. FIG. 4 shows block-to-block correspondence information which represents that CODE_1 and CODE_2 are prepared from CODE in the RTL description when a netlist is prepared from the RTL description through the logical compilation. The formal logic verification system compares the RTL description and the netlist by utilization of the block-to-block correspondence information.

More specifically, the formal logic verification system according to the first embodiment, at first, compares the description of a CODE block in the RTL description and the description of CODE=hd =131 in the netlist, on the basis of the block-to-block correspondence information shown in FIG. 4. As a result, if no match exists between the descriptions relating, to these two blocks, these blocks are determined to not logically match each other. In contrast, if a match exists between the descriptions, then, the description relating to CODE_1 is compared with the description relating to CODE_2.

Comparison between the CODE_1 block and the CODE_2 block is equivalent to comparison between the CODE block in the RTL description and the CODE_2 block in the netlist. Accordingly, comparison between the CODE block (i.e., the RTL description) and the CODE_2 block (i.e., the netlist) can be omitted as a result of comparison between the CODE_1 block and the CODE_2 block.

Both the CODE_1 block and the CODE_2 block are described in the same format, i.e., in the form of a netlist. Consequently, such a comparison can be performed more readily than a comparison between the CODE block (i.e., the RTL description) and the CODE_2 block (i.e., the netlist), namely, the comparison between two blocks written in different structures. Accordingly, the formal logic comparison system according to the first embodiment can perform formal logic verification operations in a period of time shorter than that required by a system which sequentially compares a plurality of functional blocks existing in the netlist with functional blocks of the RTL description.

Second Embodiment

A formal logic verification system according to a second embodiment of the present invention will now be described by reference to FIGS. 5 and 6 in conjunction with FIGS. 1 through 4.

FIG. 5 shows a second example of the RTL description relating to the circuit (LSI 10) shown in FIG. 1. In a case where the LSI 10 is represented by an RTL description such as that shown in FIG. 5, the formal logic verification system according to the second embodiment perceives a hierarchical structure of the circuit when reading the RTL description. More specifically, the system perceives the highest-level functional block in hierarchy as an LSI, as well as perceives that CODEs 12 and 14 exist in a lower level than that of the LSI, and ADD blocks (not shown in FIG. 1 but shown in FIG. 5) exist in a lower level than that of the CODEs 12 and 14.

After having perceived a hierarchical structure of the circuit, the formal logic verification system according to the second embodiment generates hierarchical information representing the configuration of the circuit. FIG. 6 shows hierarchical information produced so as to correspond to the RTL description shown in FIG. 5. In FIG. 6, a numeral following a keyword "level" depicts a level in hierarchy. In the second embodiment, the highest level in hierarchy is 0. The numeral representing a level in hierarchy increase as the level of the functional block is decreased.

When carrying out formal logic verification of the LSI 10, the formal logic verification system according to the second embodiment perceives that the lowest-level functional block of the LSI 10 is an ADD block, on the basis of the hierarchy information shown in FIG. 6. At the time of comparison between the RTL description and the netlist, the formal logic verification system compares ADD blocks at first in the manner used in the first embodiment. After completion of the comparison among all the ADD blocks, sequential comparison among the functional blocks in higher levels in hierarchy (such as CODEs and LSIs) is carried out according to the method described with reference to the first embodiment.

In a case where comparison between functional blocks in lower hierarchy levels (e.g., ADD blocks) is carried out prior to comparison between functional blocks (e.g., CODE blocks) in higher hierarchy levels, at the time when comparison of higher-level functional blocks is commenced, there are included some descriptions which are already logically verified in the descriptions relating to the higher-level functional blocks. At the time of formal logic verification of individual functional blocks, the formal logic verification system performs comparison between an RTL description and a netlist or between netlists while excluding the descriptions that have already logically verified. Therefore, the formal logic circuit verification system according to the second embodiment eliminates useless overlapping verification operations, thereby shortening the time required for comparing the RTL description and the netlist.

Third Embodiment

A third embodiment of the present invention will now be described with reference to FIGS. 1 through 5 and 7 through 9.

FIG. 7 shows a second example of the netlist relating to the circuit (LSI 10) shown in FIG. 1. More specifically, FIG. 7 shows a netlist prepared by logical compilation of the RTL description shown in FIG. 5.

The RTL description shown in FIG. 5 includes a single, description relating to CODE provided so as to commonly apply to a plurality of CODE blocks (U1 and U2) and a single description relating to ADD provided so as to commonly apply to a plurality of ADD blocks (SU1, SU2, . . . ). In contrast, the netlist shown in FIG. 7 includes descriptions relating to a plurality of CODE blocks (i.e., relating to CODE_1 and CODE_2), and descriptions relating to a plurality of ADD blocks (i.e., relating to ADD_11, ADD_12, ADD_21 and ADD_22).

Figures 8, 9, 10:
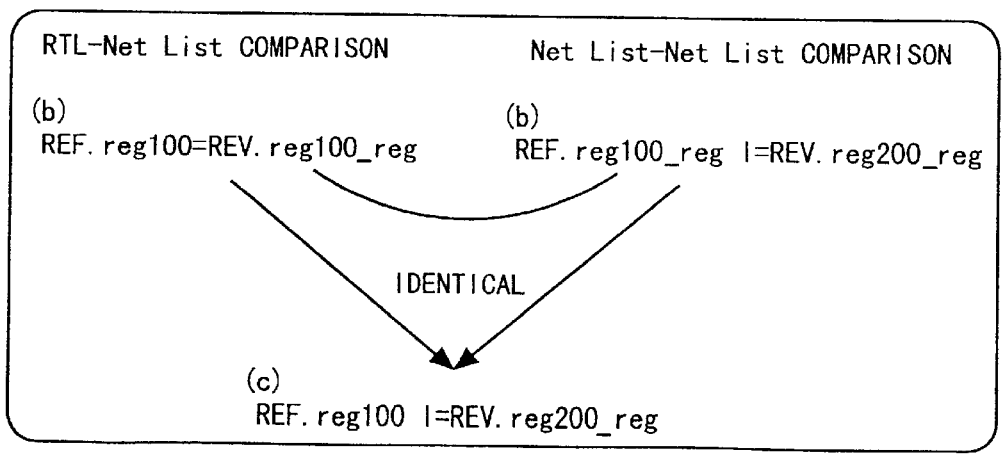
FIG. 8 shows an example of a checklist employed in a third embodiment of the present invention.
FIG. 9 shows a status of the checklist in which some checks are written.
FIG. 10 is a schematic representation for describing a method under which mismatch information is prepared in a fifth embodiment of the present invention.

When comparing the RTL description with the netlist, the formal logic verification system according to the third embodiment prepares a comparison checklist as shown in FIG. 8. In the left column shown in FIG. 8 are listed items of the RTL description; namely, items corresponding to the CODE and ADD blocks. Further, the right column shown in FIG. 8 provides items of the netlist; i.e., descriptions which relate to CODE_1, CODE_2, ADD_11, ADD_12, ADD_21, and ADD_22. In the check list shown in FIG. 8, these items are suffixed with a symbol "−1," which represents that the items have not yet undergone comparison.

The formal logic verification system according to the third embodiment compares the RTL description with the netlist according to the method employed in the second embodiment. More specifically, the RTL description and the netlists are compared with one another according to the method in which comparison among the functional blocks in the lowest hierarchy level is performed first, then the functional blocks in the higher hierarchy levels are compared in such a way that repetition of comparison is omitted. During the comparison, every time comparison between the functional blocks is completed, the formal logic verification system according to the third embodiment checks the items of the thus-compared functional blocks.

FIG. 9 shows the status of the checklist after completion, of comparison among all the ADD blocks. In FIG. 9, items of the functional blocks that have undergone comparison are suffixed with a symbol "0," which represents that the item has undergone comparison. At the time of comparing the CODE blocks, the formal, logic verification system performs comparison while eliminating the descriptions relating to the ADD blocks (i.e., ADD_11, ADD_12, ADD_21, and ADD_22) that have been already compared by referenced to the check list shown in FIG. 9. The above-described comparison operations enable a reduction in the capacity of memory and the capacity of a disk required for comparing the RTL description with the netlist.

Fourth Embodiment

A formal logic verification system according to a fourth embodiment of the present invention will now be described. Like the systems according to the first through third embodiments, the formal logic verification system according to the fourth embodiment compares the RTL description of a functional block with one of the net-list descriptions of functional blocks at, first, and if a match is found to exist between the descriptions, then compares the netlists with each other. The formal logic verification system according to the fourth embodiment is characterized in that, when no match is found to exist between the netlists, performing the above-mentioned comparison again subjecting only the descriptions of the netlist that have not yet undergone comparison.

Hereinafter, an explanation will be given of a case where it is predetermined that during the comparison relating to the functional blocks in the lowest hierarchy level; i.e., relating to the ADD blocks, the blocks ADD_11, ADD_12, ADD_21, and ADD_22 (see FIG. 7) included in the netlist should be verified in this, sequence.

Under the foregoing condition, during the comparison relating the ADD blocks, the RTL description relating to the ADD blocks (see FIG. 5) are compared with the description relating to Add_11 block in the netlist (see FIG. 7) at first. Then, if the match between the descriptions exist, the descriptions of the netlists, i.e., the ADD_11 and ADD_12 are compared with each other.

If a match is acknowledged to exist between ADD_11 and ADD_12 as a result of comparison, processing operations subsequent to the comparison step will be carried out, as in the case with the previous embodiments. In contrast, if no match is acknowledged to exist between ADD_11 and ADD_12, a description relating to ADD_21 to be compared after ADD_12 is compared with the RTL description of the ADD block (see FIG. 5). If a match is found to exist as a result of the comparison, ADD_21 is compared with ADD_22.

According to the foregoing processing, regardless of results of such comparison relating to the individual functional blocks, the RTL description and the netlist are compared with respect to all the functional blocks included in the LSI 10. Accordingly, the formal logic verification system according to the fourth embodiment always enables logic verification of the entire circuit.

In the fourth embodiment, when no match is acknowledged to exist between the netlists, the description relating to the next netlist to be compared is compared with the RTL description. However, the present invention is not limited to such an embodiment. More specifically, if there exists a netlist that has already been determined to match the RTL description, the next netlist to be compared may be compared with this netlist.

Fifth Embodiment

A formal logic verification system according to a fifths embodiment of the present invention will now be described with reference to FIG. 10 along with FIGS. 1 through 9.

FIG. 10 is a schematic representation for describing a method under which the formal logic verification system according to the fifth embodiment prepares mismatch information; i.e., information representing descriptions in which the netlist and the RTL description do not match.

In FIG. 10, items prefixed with REF or REV represent items used as reference in comparison or items to be compared. Further, in FIG. 10, reg100 represents a comparison point in the ADD block (RTL description); reg100_reg represents a comparison point in ADD_11 (netlist); and reg200_reg represents a comparison point in ADD_12 (netlist) . In FIG. 10, symbol "=" represents logical equivalence between two terms; and symbol "!=" represents logical non-equivalence between two terms.

Expression (b) shown in FIG. 10 represents that the comparison point reg100 of the ADD block (RTL description) is equivalent to the comparison point reg100_reg of ADD_11 (netlist). If the ADD block (RTL description) is equivalent to ADD_11 (the netlist), the formal logic verification system compares ADD_11 (netlist) with ADD_12 (netlist).

Expression (a) shown in FIG. 10 represents that the comparison point reg100_reg of ADD_11 is not equivalent to the. comparison point reg200_reg of ADD_12. In the fifth embodiment, if such a determination is made, the formal logic verification system extracts point reg100 matching the comparison point reg100_reg of ADD_11 (netlist) from the comparison points of the ADD block (RTL description). Further, the formal logic verification system generates mismatch information regarding the comparison point redo_reg [expression (c)], through use of the thus-extracted comparison point reg100.

The formal logic verification system according to the fifth embodiment generates mismatch information through the previously-described manner with regard to all comparison points in the functional blocks. Accordingly, the formal logic verification system according to the fifth embodiment enables generation of mismatch information between the RTL description, and the netlist, while increasing processing speed by comparing: netlists with each other.

Sixth Embodiment

A formal logic verification system according to a sixth, embodiment of the present invention will now be described by reference to FIGS. 11 and 12.

Figure 11:
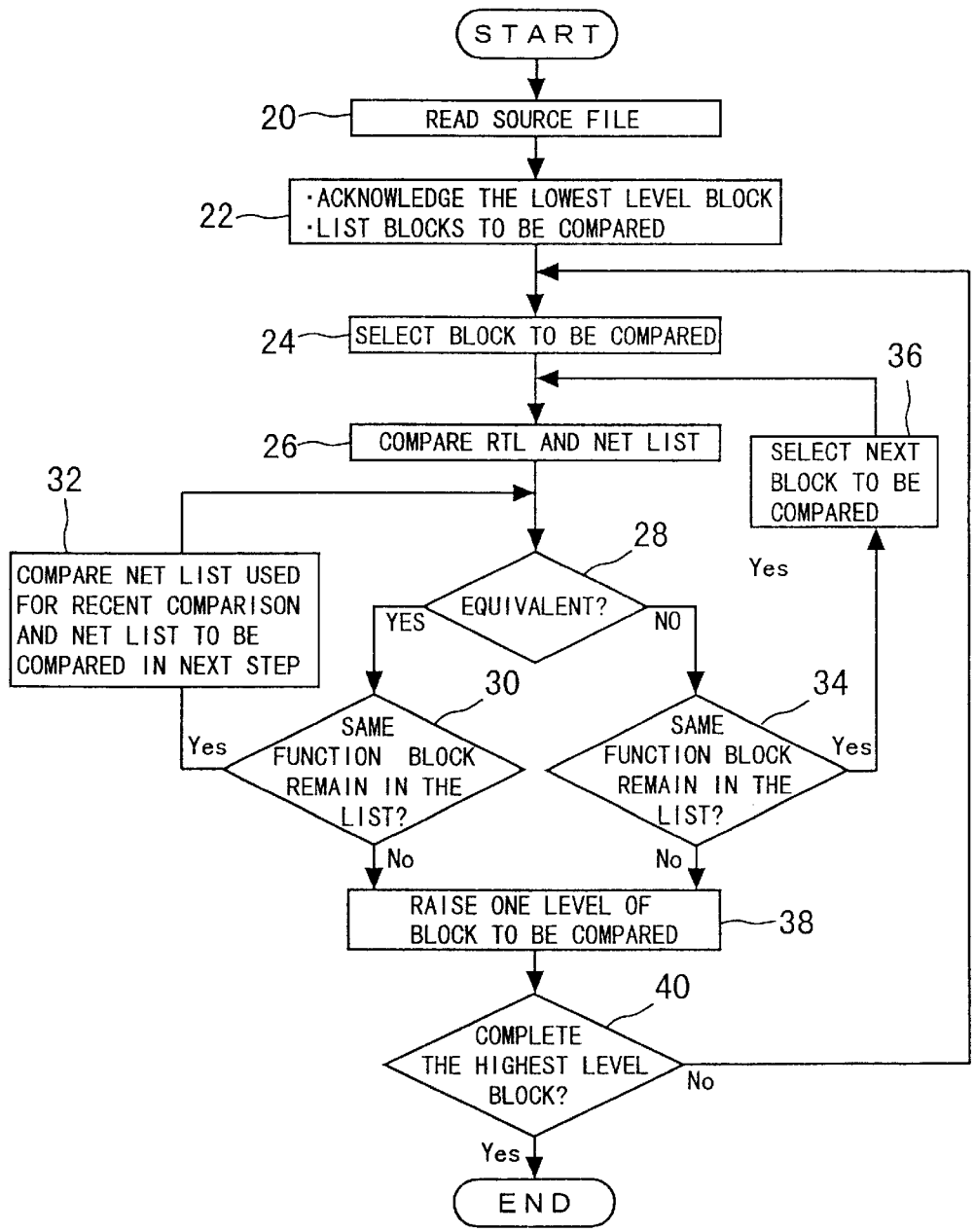
FIG. 11 is a flowchart showing a round of processing operations performed by a formal logic verification system according to a sixth embodiment of the present invention.

FIG. 11 is a flowchart showing a round of processing operations performed by the formal logic verification system according to the sixth embodiment. Through the round of processing operations shown in FIG. 11, the foregoing functions according to the first through fifth embodiments can be fulfilled.

The round of processing operations shown in FIG. 11 is performed every time the formal logic verification between the RTL description and the netlist is requested. If a request for the round of processing operations is issued, the formal logic verification system initially carries out processing relating to step 20.

In step 20, source files regarding the RTL description, and the netlists related to a circuit to be logically verified are read from a database. The source files read in step 20 comprise block-to-block correspondence information such as that shown in FIG. 4.

In step 22, hierarchy information such as that shown in FIG. 6 is formed from the RTL description. On the basis of the thus-prepared hierarchy information, blocks in the lowest hierarchy level among the functional blocks included in the circuit are acknowledged. Further, in step 22, a list relating to functional blocks to be compared is prepared on the basis of the block-to-block information (see FIG. 4).

In step 24, functional blocks to be compared during a current processing cycle is selected. In this processing, a functional block in a lower hierarchy level (i.e., a functional block assigned a higher level number such as that shown in FIG. 6) is selected in preference to a functional block in a higher hierarchy level (i.e., a functional block assigned a lower level number such as that shown in FIG. 6). Through the foregoing processing, the functions according to the second embodiment are fulfilled.

In step 26, comparison between the RTL description and the netlist is carried out with regard to the functional block selected as a block to be compared. Comparison processing relating to step 26 is efficiently carried out so that repetition of comparison points is prevented, by utilization of the check list as shown in FIG. 8 or 9. During the processing relating to step 26, a comparison result such as that shown in FIG. 10 is prepared every time comparison between the comparison points is completed.

In step 28, a determination is made as to whether or not a match exists between the two descriptions that have been compared to each other. As a result, if a match is acknowledged to exist between the descriptions, processing relating to step 30 is next carried out. In contrast, if no match is acknowledged to exist between the descriptions, processing relating to step 34 is next carried out.

In step 30, a determination is made as to whether or not a block which has the same function as that of the block subjected to the comparison in this cycle and which has not yet undergone comparison is still included in the functional blocks listed through the processing relating to step 22. If it is determined that such a functional block is not present in the list, processing relating to step 38 is performed. In contrast, if it is determined that such a functional block still exists in the list, processing relating to step 32 is carried out.

In step 32, a description relating to a netlist which is determined as the next candidate for comparison under a predetermined rule is compared with the description of the netlist used for recent comparison. In step 32, as in the case with step 26, the descriptions are efficiently compared through use of the check list (shown in FIG. 8 or 9), thereby fulfilling the functions described with reference to the third embodiment. Further, in the present step 32, the mismatch information shown in FIG. 10 is prepared through comparison between descriptions, thus fulfilling the functions described with reference to the fifth embodiment. After completion of processing relating to step 32, processing relating to step 28 is again performed.

Figure 12:
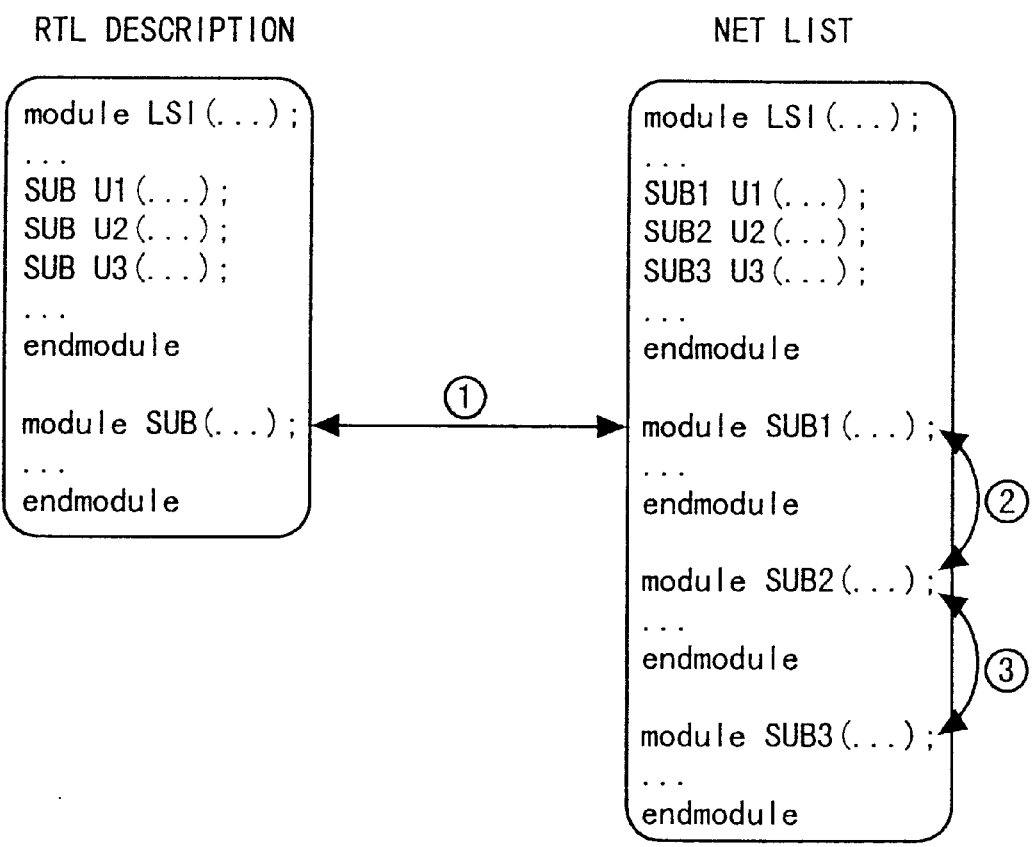
FIG. 12 is a schematic representation for describing a characteristic operation performed by the sixth embodiment of the present invention.
Figure 13:
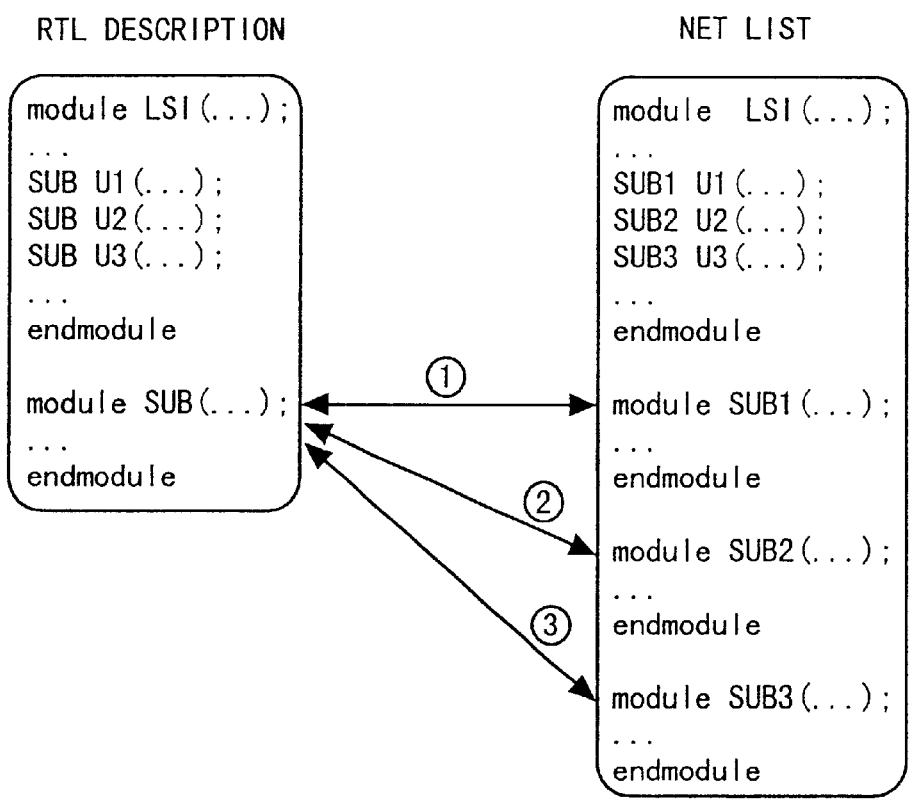
FIG. 13 is a schematic representation for describing an operation of a conventional formal logic verification system.

FIG. 12 shows the sequence in which descriptions are compared in association with the previously-described processing relating to steps 26 to 32. In step 26, the descriptions assigned reference numeral ① in FIG. 12 are compared with each other. Through repetitions of processing relating to steps 28 to 32, the descriptions assigned reference numeral ② or the descriptions assigned reference numeral ③, all of which are shown in FIG. 12, are compared with each other. As mentioned previously, the foregoing processing procedures enable fulfillment of the functions described with reference to the first embodiment.

In step 34, as in the case with step 30, a determination is made as to whether or not there still remains a block which has the same function as that of the block processed in the current cycle and which has not yet undergone comparison. If it is determined that such a functional block is not present, processing relating to step 38 is performed. In contrast, if it is determined that such a functional block still remains, processing relating to step 36 is carried out.

In step 36, one of the functional blocks that have not yet undergone comparison is taken as an object of comparison. After completion of processing relating to step 36, processing operation relating to step 26 is again performed. Even when none of the functional blocks is determined to match the other functional blocks during the process of formal logic verification, the previously-described processing procedures enable verification of all the functional blocks at all times, thereby fulfilling the functions described with reference to the fourth embodiment.

In step 38, on the basis of the hierarchy information such as that shown in FIG. 6, the hierarchy level of the blocks to be compared is incremented by one.

In step 40, a determination is made as to whether or note the descriptions relating to the blocks in the highest hierarchy level have undergone comparison. If it is determined that the blocks in the highest hierarchy level have not yet undergone comparison, processing procedure relating to step 24 is carried out with regard to the hierarchy level that is taken as a new object of comparison through processing relating to step 38. In contrast, it is determined that the blocks in the highest hierarchy level have already undergone comparison, the round of processing operations shown in FIG. 11 is completed.

As mentioned above, through execution of the round of processing operations shown in FIG. 11, the formal logic verification system according to the sixth embodiment efficiently compares the RTL description with the netlist while fulfilling the functions described with reference to the first through fifth embodiments.

The major benefits of the present invention described above are summarized as follows:

According to a first aspect of the present invention, the frequency of comparison between an RTL description and a netlist is reduced through comparison among descriptions of netlists, thereby shortening the time required for formal logic verification of a circuit.

According to a second aspect of the present invention, a relationship between an instance name in the RTL description and an instance name in the netlist can be readily ascertained through reference to block-to-block correspondence infomatio. Thus, the present invention enables easy extraction of descriptions relating to the same functional block; i.e., descriptions to be compared each other, from the descriptions of the netlist.

According to a third aspect of the present invention, a hierarchy structure of a circuit is readily ascertained on the basis of hierarchy information. Through use of the information, descriptions relating to blocks can be compared from lower hierarchy level to higher hierarchy level. Accordingly, the present invention enables efficient comparison among descriptions relating to functional blocks.

According to a fourth aspect of the present invention, the blocks in the higher hierarchy levels can be compared so as to exclude the blocks that have been compared during the process of comparison relating to the blocks in the lower hierarchy levels. Accordingly, the present invention enables efficient formal logic verification of a circuit.

According to a fifth aspect of the present invention, the functional blocks that have already undergone comparison can be readily detected by reference to a checklist. The present invention enables easy detection of blocks that should be excluded from blocks to be compared.

According to a sixth aspect of the present invention, after a logical mismatch has been acknowledged to exist between descriptions of the netlist, comparison between the descriptions of the netlist that have not yet been compared and the RTL description maybe commenced. Thus, even when a logical mismatch exists between the RTL description and the netlist, the present invention enables formal logic verification of all the functional blocks at all times.

According to a seventh aspect of the present invention, after comparison has shown the existence of a logical mismatch between the descriptions of the netlist, there can be commenced comparison between the descriptions of the netlist that have not undergone comparison and the descriptions of the netlist that have already been verified as logically matching. Accordingly, the present invention enables formal logic verification of all the functional blocks within a short period of time at all times.

According to an eighth aspect of the present invention, regardless of comparison between the descriptions of the netlist in place of comparison between the RTL description and the descriptions of the netlist, information about mismatch between the RTL description and the netlist can be obtained.

Further, the present invention is not limited to these embodiments, but variations and modifications may be made without departing from the scope of the present invention.

The entire disclosure of Japanese Patent Application No. Hei 11-45025 filed on Feb. 23, 1999 including specification, claims, drawings and summary are incorporated herein by reference in its entirety.

What is claimed is:

1. A formal logic verification system for verifying logical equivalence between a register-transfer-level (RTL) description and a gate level netlist obtained through logical compilation of RTL descriptions, the system comprising:
   RTL-to-netlist comparison means which, when a plurality of identical functional blocks are included in a circuit, compares a description that relates to the functional blocks and is included in the RTL description with one of a plurality of descriptions that relate to the functional blocks and are included in the netlist; and
   netlist-to-netlist comparison means for comparing the plurality of descriptions relating to the functional blocks included in the same netlist.

2. The formal logic verification system according to claim 1, further comprising:
   block-to-block correspondence information preparation means for producing information about correspondence between an instance name in the RTL description and an instance name in the netlist both of which relate to the same functional blocks included in the circuit, and
   wherein the netlist-to-netlist comparison means extracts descriptions relating to the same functional blocks from among the netlist, on the basis of the block-to-block correspondence information.

3. The formal logic verification system according to claim 1, further comprising:
   hierarchy information preparation means for preparing, from the RTL description, hierarchy information about the functional blocks included in the circuit, and
   wherein at least one of the RTL-to-netlist comparison means and the netlist-to-netlist comparison means compares the functional blocks in a stepwise manner from the lowest hierarchy level to higher hierarchy levels.

4. The formal logic verification system according to claim 3, wherein at least one of the RTL-to-netlist comparison means and the netlist-to-netlist comparison means compares with one another the functional blocks to be compared, by exclusion of the descriptions that have already undergone comparison during the course of comparison among the functional blocks in the lower hierarchy levels, from the descriptions relating to the functional blocks.

5. The formal logic verification system according to claim 4, wherein at least one of the RTL-to-netlist comparison and the netlist-to-netlist comparison means further comprises checklist preparation means for preparing a check list for recording the blocks that have already undergone comparison, and extracts descriptions to be excluded from descriptions to be compared, by reference to the check list.

6. The formal logic verification system according to claim 1, wherein
   the RTL-to-netlist comparison means compares the functional blocks until a description matching the RTL description is found in the netlist before the net-list-to-net-list comparison means compares the netlists; and
   the netlist-to-netlist comparison means compares descriptions of the netlist with each other while using the description of the netlist that has been verified as logically matching the RTL description by means of the RTL-to-netlist comparison means as the first reference description,
   wherein, when the netlist-to-netlist comparison means ascertains mismatch between the descriptions of the netlist, the RTL-to-netlist comparison means again compares the functional blocks until a description matching the RTL description is found in the description that have not yet undergone comparison; and the netlist-to-netlist comparison means again compares the descriptions of the netlist with each other while using they description of a new netlist that has been verified as logically matching the RTL description as a reference description.

7. The formal logic verification system according to claim 1, wherein the RTL-to-netlist comparison means compares the functional blocks until a description matching the RTL description is found in the netlist before the net-list-to-netlist comparison means compares the netlists; and the netlist-to-netlist comparison means compares descriptions of the netlist with each other while using the description of the netlist that has been verified as logically matching the RTL description by means of the RTL-to-netlist comparison means as the first reference description, wherein, when a mismatch is acknowledged to exist between the descriptions of the netlist as a result of comparison, there is resumed comparison of the descriptions of the netlist targeting descriptions that have not yet undergone comparison while using a description of the netlist that has already been verified as logically matching the RTL description as a reference description.

8. The formal logic verification system according to claim 1, wherein the RTL-to-netlist comparison means generates first result information representing result of comparison between the RTL description and the netlist at a comparison point included in the descriptions related to the function blocks;

the netlist-to-netlist comparison means generates second result information representing result of comparison between the netlists at a comparison point included in the descriptions related to the functional blocks; and the formal logic verification system further comprises mismatch information generation means which, when the net-list-to-net-list means ascertains a logical mismatch between the descriptions, generates information about mismatch between the description of the netlist and the description of the RTL, on the basis of the first and second information results.

9. A formal logic verification method for verifying logical equivalence between a register-transfer-level (RTL) description and a gate level netlist obtained through logical compilation of RTL descriptions, the method comprising the steps of:

in response to a plurality of identical functional blocks being included in a circuit, comparing a description that relates to the functional blocks and is included in the RTL description with a description of the netlist until a description logically matching the description that relates to the functional blocks and is included in the RTL description being found in a plurality of descriptions in the netlist; and comparing a plurality of descriptions relating to the functional block included in the netlist with each other using the description of the netlist that is acknowledged to logically match the RTL description as a reference description.

10. The formal logic verification method according to claim 9, further comprising a step of preparing, from the RTL description, hierarchy information about the functional blocks included in the circuit, and wherein, in at least one of the step of comparing the RTL description with the description of the netlist and the step of; comparing descriptions of the netlist with one another, comparison between the functional blocks is performed in a stepwise manner from the lowest hierarchy level to higher hierarchy levels.

11. The formal logic verification method according to 10, wherein, in at least one of the step of comparing the RTL description with the description of the netlist and the step of comparing descriptions of the netlist with one another, comparison between the descriptions is performed by exclusion of the descriptions that have already compared during the course of comparison relating to the functional blocks in the lower hierarchy levels.

12. The formal logic verification method according to claim 9, further comprising the steps of:

comparing the RTL description with the netlist again after a mismatch has been admitted as existing between the descriptions of the netlist, until a description logically matching the RTL description is found to in the descriptions that are included in the netlist and have not yet undergone comparison; and comparing the descriptions of the netlist with each other again while using the description of a new netlist that has been verified as logically matching the RTL description through comparison in the above step as the reference description.

13. The formal logic verification method according to claim 9, wherein, when a mismatch is acknowledged to exist between the descriptions of the netlist, there is resumed comparison of the descriptions of the netlist targeting descriptions that have not yet undergone comparison while using a description of the netlist that has already been verified a logically matching the RTL description as the reference description.

14. The formal logic verification method according to claim 9, further comprising the steps of:

comparing the RTL description and the netlist description at individual comparison points included in the descriptions relating to the functional blocks;

generating first result information by storing the results of the comparison between the RTL description and the netlist description;

comparing the netlist descriptions each other at individual comparison points included in the descriptions relating to the functional blocks;

generating second result information representing the result of the comparison between the netlist descriptions; and generating, from the first and second result information items, mismatch information representing mismatch between the description of the netlist and the RTL description, when a logical mismatch is acknowledged to exist between the descriptions of the netlist.

* * * * *